(12) United States Patent
Chih

(10) Patent No.: US 12,243,592 B2
(45) Date of Patent: Mar. 4, 2025

(54) ONE TIME PROGRAMMABLE MEMORY

(71) Applicant: Taiwan Semiconductor Manufacturing Company, Ltd., Hsinchu (TW)

(72) Inventor: Yu-Der Chih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/317,665

(22) Filed: May 15, 2023

(65) Prior Publication Data

US 2023/0282287 A1 Sep. 7, 2023

Related U.S. Application Data

(63) Continuation of application No. 17/693,908, filed on Mar. 14, 2022, now Pat. No. 11,651,826, which is a continuation of application No. 16/901,200, filed on Jun. 15, 2020, now Pat. No. 11,276,469.

(51) Int. Cl.
| | |
|---|---|
| G11C 16/10 | (2006.01) |
| G11C 7/06 | (2006.01) |
| G11C 7/10 | (2006.01) |
| G11C 16/04 | (2006.01) |
| G11C 16/24 | (2006.01) |
| G11C 16/26 | (2006.01) |
| G11C 17/08 | (2006.01) |

(52) U.S. Cl.
CPC ............... *G11C 16/24* (2013.01); *G11C 7/06* (2013.01); *G11C 7/1063* (2013.01); *G11C 16/0441* (2013.01); *G11C 16/10* (2013.01); *G11C 16/26* (2013.01); *G11C 17/08* (2013.01)

(58) Field of Classification Search
CPC ......... G11C 16/24; G11C 7/06; G11C 7/1063; G11C 16/0441; G11C 16/10; G11C 16/26; G11C 17/08; G11C 17/18; G11C 17/16; G11C 7/12; G11C 8/08
See application file for complete search history.

(56) References Cited

U.S. PATENT DOCUMENTS

| | | |
|---|---|---|
| 7,642,815 B2 | 1/2010 | Fort |
| 8,270,242 B2 | 9/2012 | Fort et al. |
| 10,964,399 B2 | 3/2021 | Ha |
| 11,276,469 B2 | 3/2022 | Chih |
| 11,651,826 B2 | 5/2023 | Chih |
| 2009/0073781 A1 | 3/2009 | Fort |
| 2010/0008159 A1 | 1/2010 | Fort et al. |

(Continued)

FOREIGN PATENT DOCUMENTS

| | | |
|---|---|---|
| CN | 101715594 A | 5/2010 |
| CN | 101872647 A | 10/2010 |
| KR | 10-2018-0057771 A | 5/2018 |

*Primary Examiner* — Xiaochun L Chen
(74) *Attorney, Agent, or Firm* — Merchant & Gould P.C.

(57) ABSTRACT

A memory device is provided. The memory device includes a first transistor and a second transistor connected in series with the first transistor. The second transistor is programmable between a first state and a second state. A bit line connected to the second transistor. A sense amplifier connected to the bit line. The sense amplifier is operative to sense data from the bit line. A feedback circuit connected to the sense amplifier, wherein the feedback circuit is operative to control a bit line current of the bit-line.

20 Claims, 12 Drawing Sheets

(56) References Cited

U.S. PATENT DOCUMENTS

| | | |
|---|---|---|
| 2010/0061137 A1 | 3/2010 | Kim |
| 2010/0124089 A1 | 5/2010 | Ali et al. |
| 2010/0232203 A1* | 9/2010 | Chung ................ H01L 23/5252 |
| | | 365/96 |
| 2010/0329023 A1 | 12/2010 | Fort et al. |
| 2015/0269978 A1* | 9/2015 | Jung ...................... G11C 7/062 |
| | | 365/207 |
| 2016/0148705 A1 | 5/2016 | Lee et al. |
| 2016/0172053 A1 | 6/2016 | Ha |
| 2020/0219570 A1 | 7/2020 | Ha |

\* cited by examiner

ONE TIME PROGRAMMABLE MEMORY

CROSS-REFERENCE TO RELATED APPLICATION

This application is a continuation of U.S. patent application Ser. No. 17/693,908 filed Mar. 14, 2022, which is a continuation of U.S. patent application Ser. No. 16/901,200 filed Jun. 15, 2020, now U.S. Pat. No. 11,276,569, the disclosure of each of the aforesaid applications is incorporated herein by reference in its entirety.

BACKGROUND

Anti-fuse memories include memory cells, whose terminals are disconnected before programming, and are shorted/connected after the programming. The anti-fuse memories may be based on Metal-Oxide Semiconductor (MOS) technology, wherein the gate dielectrics of MOS capacitors/transistors are broken down to cause the gate and the source/drain regions of a programming capacitor/transistor to be interconnected. Anti-fuse cells have the advantageous features of reverse-engineering proofing, since the programming states of the anti-fuse cells cannot easily be determined through reverse engineering. An example of anti-fuse memories include one-time programmable (OTP) memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
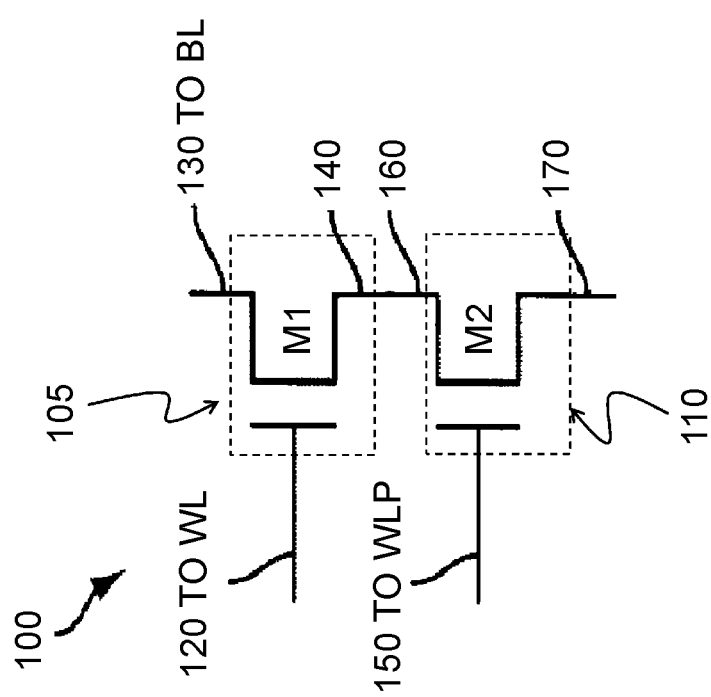
FIG. 1 is a diagram of a memory cell using an anti-fuse, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a memory cell 100 with an anti-fuse device, in accordance with some embodiments. For example, and as shown in FIG. 1, memory cell 100 includes a first transistor (that is, M1) 105 and a second transistor (that is, M2) 110. In example embodiments, first transistor 105 is a data transistor and second transistor 110 is an anti-fuse. First transistor 105 is connected in series with second transistor 110. Memory cell 100 can be a one-time programmable (OTP) memory cell.

First transistor 105 includes a gate 120, a drain 130, and a source 140. Gate 120 is connected to a word line (WL) and drain 130 is connected to a bit line (BL). In example embodiments, first transistor 105 is symmetrical. That is, a source (that is, source 140) can be selected to be a drain (that is, drain 130) while a drain (that is, drain 130) can be selected to be a source (that is, source 140). Examples of first transistor 105 may include a metal oxide semiconductor field effect transistor (MOSFET), an n-channel metal oxide semiconductor (nMOS) transistor, a p-channel metal oxide semiconductor transistor (pMOS), and a complementary metal oxide semiconductor (CMOS) transistor. However, other types of transistors are within the scope of the disclosure.

Second transistor 110 includes a gate 150, a drain 160, and a source 170. Source 140 of first transistor 105 is connected to drain 160 of second transistor 110. Gate 150 of second transistor 110 is connected to a word line programmable (WLP) and source 170 is floating. In some examples, source 170 of second transistor 110 is connected to the ground. In example embodiments, second transistor 110 is symmetrical. That is, a source (that is, source 170) can be selected to be a drain (that is, drain 160) while a drain (that is, drain 160) can be selected to be a source (that is, source 170). Examples of second transistor 110 may include a MOSFET, an nMOS transistor, a pMOS transistor, and a CMOS transistor. However, other types of transistors are within the scope of the disclosure.

In memory cell 100 of FIG. 1, second transistor 110 is used as an anti-fuse with drain 160 and source 170 as two terminals of the anti-fuse. Before being programmed, second transistor 110 is not operational. That is, drain 160 and source 170 are not electrically connected. For example, an impedance between drain 160 and source 170 is high resulting in no current flow between drain 160 and source 170. Hence, the anti-fuse is open. After being programmed, the anti-fuse is closed. That is, after being programmed, drain 160 and source 170 are electrically connected or shorted. In some examples, the anti-fuse can include a capacitor (not shown). In example embodiments, memory cell 100 is symmetrical. That is, instead of second transistor 110, first transistor 105 can be the anti-fuse with drain 130 and source 140 as two terminals of the anti-fuse.

Figure 2:
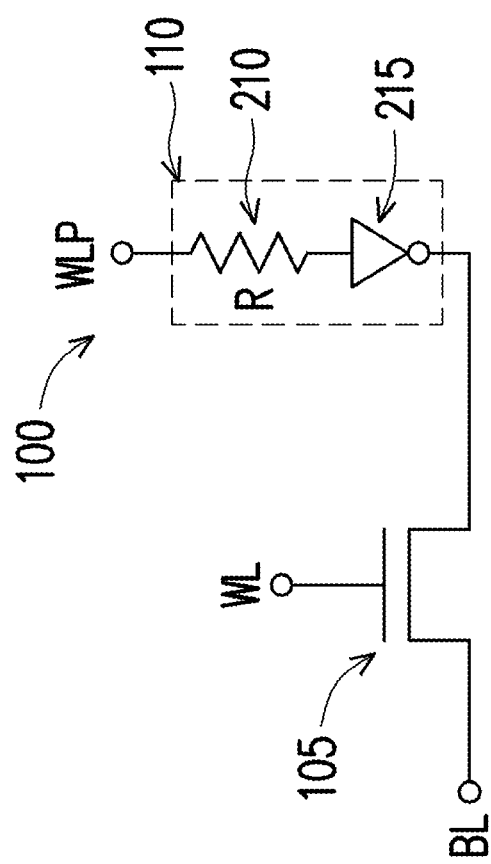
FIG. 2 is a diagram of a memory cell using an anti-fuse after programming of the anti-fuse, in accordance with some embodiments.

FIG. 2 illustrates a schematic diagram of memory cell 100 with an anti-fuse after programming in accordance with some embodiments. After programming, second transistor 110 (that is, the anti-fuse) is broken down, forming a conductive path with a resistor R 210 and a diode 215. However, it will be apparent to a person with the ordinary skill in the art after reading this disclosure that the conductive path for second transistor 110 can be represented only by resistor 210. In example embodiments, the anti-fuse (that is, second transistor 110), when programmed is permanently broken down.

Referring back to FIG. 1, to program the anti-fuse, gate 150 is controlled (that is, switch second transistor 110 on or off) and a programming voltage having a predetermined amplitude and duration is applied to drain 160. For example, second transistor 110 is switched-off when the voltage at gate 150 to source 170 ($V_{GS}$ of second transistor 110) is less than a threshold voltage, for example, voltage $V_T$ that turns second transistor 110 on. In example embodiments, the $V_T$ for second transistor 110 is approximately about 0.4V. That is, second transistor 110 is switched-on at about 0.4V. In some embodiments, the amplitude for the programming voltage is in the range of 1.5-2.0V, and its programming duration is in the range of 50 to 100 microseconds (uS). However, it will be apparent to a person skilled in that art after reading this disclosure that depending on implementations and variations of process technologies, each of the voltage to control gate 150 (that is, to turn it off and to turn it on) and the amplitude and duration of the programming voltage varies.

Figure 3:
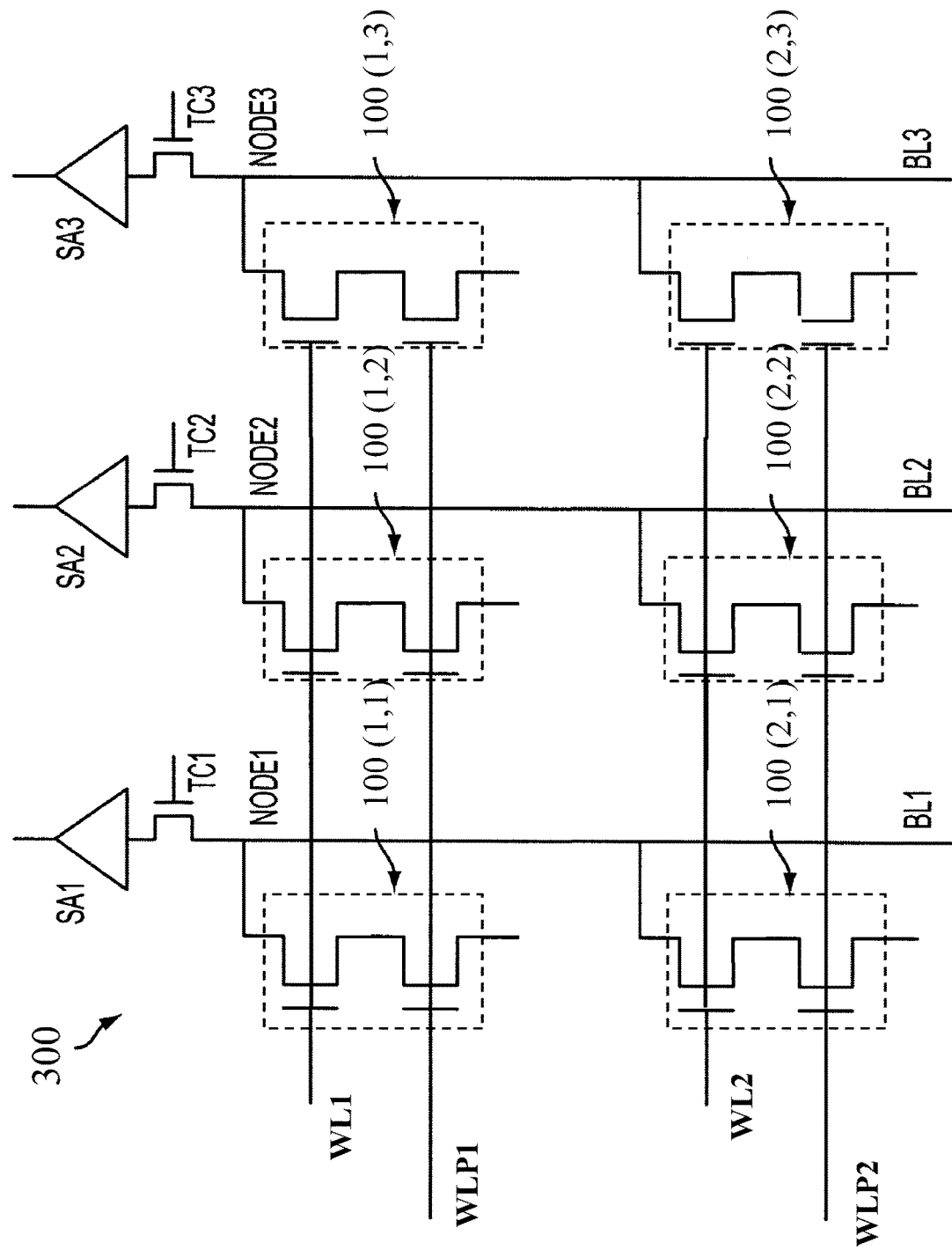
FIG. 3 is a diagram of a memory array with an anti-fuse, in accordance with some embodiments.

FIG. 3 shows a memory array 300, in accordance with an embodiment. Memory array 300 includes multiple memory cells 100. For example, for illustration purposes, memory array 300 includes two rows and three columns and thus six memory cells 100, for example, a first memory cell 100(1,1), a second memory cell 100(1,2), a third memory cell 100(1,3), a fourth memory cell 100(2,1), a fifth memory cell 100(2,2), and a sixth memory cell 100(2,3). Each of multiple memory cells 100 of memory array 300 include first transistor 105 and second transistor 110. Each of first transistor 105 and second transistor 110 of multiple memory cells 100 of memory array 300 include a gate a drain, and a source as shown in FIG. 1. However, for simplicity, reference numbers for each first transistor 105 and second transistor 110 are not shown in FIG. 3. Moreover, for simplicity, reference numbers for each gate, drain and source of first transistor 105 and second transistor 110 are not shown.

Memory array 300 further include sense amplifiers (SAs) (that is, a first sense amplifier SA1, a second sense amplifier SA2, a third sense amplifier SA3, etc.), transistors TC (e.g., a first transistor TC1, a second transistor TC2, a third transistor TC3, etc.), nodes NODE (that is, a first node NODE1, a second node NODE2, a third node NODE3, etc.). In addition, memory array 300 further includes word lines (that is, a first word line WL1, a second word line WL2, etc.), bit lines (that is, a first bit line BL1, a second bit line BL2, a third bit line BL3, etc.), and word line programmable WLP (that is, a first word line programmable WLP1, a second word line programmable WLP2, etc.).

First sense amplifier SA1 is connected to first transistor TC1 which is connected to first bit line BL1. Similarly, second sense amplifier SA2 is connected to second transistor TC2 which is connected to second bit line BL2. In addition, third sense amplifier SA3 is connected to third transistor TC3 which is connected to third bit line BL3. First memory cell 100(1,1), second memory cell 100(1,2), and third memory cell 100(1,3) are connected to first word line WL2 and first word line programmable WLP1. In addition, fourth memory cell 100(2,1), fifth memory cell 100(2,2), and sixth memory cell 100(2,3) are connected to second word line WL2 and second word line programmable WLP2.

Those skilled in the art will recognize after reading this disclosure that the word lines of memory array 300 may be referred to as X-decoders while the bit lines of memory array 300 may be referred to as Y-decoders. Further, memory array 300 is shown to have six memory cells 100 for illustration only, other embodiments include memory arrays having different configurations with different numbers of memory cells 100, rows and columns, and the operation of such memory arrays is apparent to a person of ordinary skill in the art from the above examples. Additionally, variations of memory cells 100 are used in memory arrays in accordance with one or more embodiments. The instant disclosure is not limited to any particular configuration or variation of a memory cell/array.

Sense amplifiers (that is, first sense amplifier SA1, second sense amplifier SA2, and third sense amplifier SA3) in conjunction with transistors TC (that is, first transistor TC1, second transistor TC2, and third transistor TC3) are operative to read the logic level of each memory cell 100. In effect, the sense amplifiers detect an impedance at nodes NODE (that is, first node NODE1, second node NODE2, and third node NODE3) for a corresponding memory cell 100. If the impedance is at a logic high, then a corresponding memory cell 100 is also at a logic high (that is, it stores a bit value of zero). Conversely, if the impedance is at a logic low, then corresponding memory cell 100 is also at a logic low (that is, it stores a bit value of one). For example, if first memory cell 100(1,1) is selected, then a logic high at first node NODE1 indicates that first memory cell 100(1,1) is also at a logic high, and a logic low at first node NODE1 indicates that first memory cell 100(1,1) is also at a logic low, etc.

For another example, if fourth memory cell 100(2,1) is selected, then a logic high at first node NODE1 indicates that fourth memory cell 100(2,1) is also at a logic high, and a logic low at first node NODE1 indicates that fourth memory cell 100(2,1) is also at a logic low, etc. Further, the impedance at a node is in effect the impedance of the anti-fuse for a particular memory cell 100. For example, the impedance at first node NODE1 for first memory cell 100(1,1) is the impedance of the anti-fuse associated with first memory cell 100(1,1). Similarly, the impedance at first NODE1 for fourth memory cell 100(2,1) is the impedance of the anti-fuse associated with fourth memory cell 100(2,1), etc. As a result, when first memory cell 100(1,1) is selected for reading, if the anti-fuse associated with first memory cell 100(1,1) is high impedance (e.g., the associated anti-fuse is open), then first memory cell 100(1,1) is at a logic high, and if the associated anti-fuse is low impedance (e.g., the associated anti-fuse is shorted), then first memory cell 100(1,1) is at a logic low, etc.

To read memory cells 100, a corresponding word line WL and a corresponding transistor TC are selected, and a corresponding sense amplifier SA senses the corresponding node NODE. When a word line WL for memory cell 100 is selected (that is, charged to a logic high), it in turn switches-on a corresponding first transistor 105 of that particular memory cell 100. For example, to read first memory cell 100(1,1) the corresponding word line WL, e.g., first word line WL1, is selected, which switches-on first transistor 105 associated with first memory cell 100(1,1). Further, first transistor TC1 is also switched-on. First sense amplifier SA1 then senses the impedance at first node NODE1. If the first node NODE1 is at a logic high then first memory cell 100(1,1) is also at a logic high, and if the first node NODE1 is at a logic low then first memory cell 100(1,1) is also at a logic low. Similarly, to read second memory cell 100(1,2), first word line WL1 is selected, which switches-on first transistor 105 associated with second memory cell 100(1,2). Further, second transistor TC2 is also switched-on. Second sense amplifier SA2 then senses the impedance at second node NODE2. If second node NODE2 is at a logic high then second memory cell 100(1,2) is also at a logic high, and if second node NODE2 is at a logic low then second memory cell 100(1,2) is also at a logic low, etc.

To program memory cells 100, a corresponding word line is selected, and the anti-fuse corresponding to connected memory cells 100 are programmed. For example, second transistor 110 of a selected memory cell 100 is switched-off, and a voltage (e.g., $V_{PROGRAM}$) having appropriate amplitude and period is applied at the corresponding bit line. As a result, a current flows from the corresponding bit line through drain 160 and shorts drain 160 and source 170 of second transistor 110. Once the anti-fuse is programmed, corresponding memory cell 100 is programmed. For example, to program first memory cell 100(1.1), first word line WL1 is selected, which switches-on first transistor 105 of first memory cell 100(1,1). The anti-fuse (that is, second transistor 110) of first memory cell 100(1,1) is switched-off by having gate 150 floated or applied with a voltage less the threshold voltage $V_T$. Voltage $V_{PROGRAM}$ having an amplitude of 1.5-2V and a period of between 50-100 uS is then applied at first bit line BL1, which will cause a current to flow from first bit line BL1 through the drain 160 of the anti-fuse (that is, second transistor 110) and shorts drain 160 and source 170.

Similarly, for programing of fifth memory cell 100(2,2), a high voltage (that is, $V_{PROGRAM}$ having an amplitude of 1.5-2V and a period of between 50-100 uS) is applied to second word line programmable WLP2 and 1.8V is applied to second word line WL2. Second bit line BL2 is pull down by a programming current. As a result, there is a high voltage across gate 120 of first transistor 105 of fifth memory cell 100(2,2), and the gate oxide of second transistor 110 of fifth memory cell 100(2,2) breaks down. The oxide breakdown creates a conduction filament (that is, resistor R 210 and diode 215 in series) between gate 150 and source 170 of second transistor 110 of fifth memory cell 100(2,2), and fifth memory cell 100(2,2) becomes a low resistance in the switched-on state.

During read operations of memory array 300, all three bit-lines (that is, first bit line BL1, second bit line BL2, third bit line BL3, etc.) are accessed at a same time. For example, for the read operations, a bit line current associated with each bit line is compared with a reference current (that is, $I_{ref}$). A bit line voltage level, therefore, depends on a bit line current (that is, $I_{load}$) which includes the reference current $I_{ref}$ and a bit line leakage current $I_{BLL}$ (also referred to as a cell current). The bit line current pulls down the word line programmable WLP voltage level and reduces a read margin. As a result, a read margin for data value of one is impacted. For example, a total bit line current during the read operation is equal to Iref×N, where N is the number of memory cells 100 in the on state (that is, data value equal to one). Thus, the bit line current during the read operation is data pattern dependent.

In example embodiments, the techniques disclosed herein overcome the data pattern dependency of the bit line current of the read operations of a one-time programmable memory. For example, in the techniques disclosed herein, the cell current is suppressed or inhibited (that is, controlled) by redirecting or shutting down using a feedback circuit. As a result, the bit line voltage level is higher for a weak bit and the read margin is improved. In addition, an unselected word line programmable WLP is biased to a voltage equal to a sense amplifier SA decision level which suppresses the bit line leakage current.

Figure 4A:
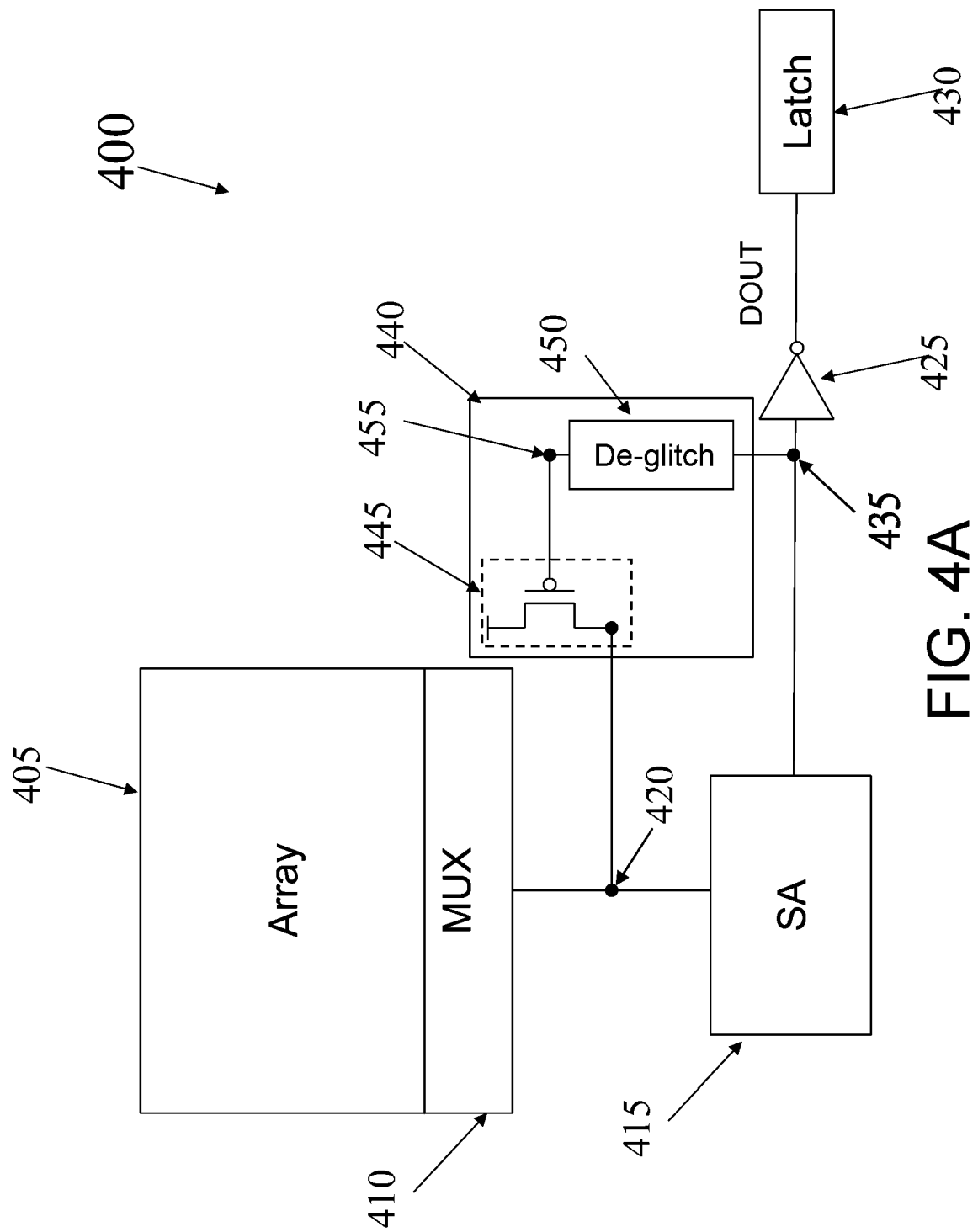
FIG. 4A illustrates a memory device with an example feedback circuit, in accordance with some embodiments.

FIG. 4A illustrates a memory device 400 with an example feedback circuit, in accordance with some embodiments. In example embodiments, memory device 400 can be a one-time programmable (OTP) memory. As shown in FIG. 4, memory device 400 includes a memory array 405 which includes a plurality of memory cells, such as, memory cell 100. The plurality of memory cells of memory array 405 are arranged in a matrix of a predetermined number of rows and columns. In example embodiments, memory array 405 is same as or similar to memory array 300 of FIG. 3.

Memory device 400 further includes a multiplexer (or MUX) 410. Multiplexer is connected or is associated with memory array 405. Multiplexer 410 is operative to assist in reading data from memory array 405 and writing data into memory array 405. Although memory device 400 is shown to include only one multiplexer, it will be apparent to a person with ordinary skill in the art after reading this disclosure that memory device 400 can include more than one multiplexer. For example, one multiplexer can be provided for every eight rows, sixteen rows, or thirty two rows of memory array 405. Moreover, although multiplexer 410 is shown to be separate from memory array 405, it will be apparent to a person with ordinary skill in the art after reading this disclosure that multiplexer 410 can be part of memory array 405.

Memory device 400 further includes a sense amplifier SA 415. Sense amplifier SA 415 is connected to memory array 405 via multiplexer 410 and is also operative to assist in reading data from memory array 405. Sense amplifier SA 415 is connected to multiplexer 410 at a first node 420. Although memory device 400 is shown to include only one sense amplifier SA, it will be apparent to a person with ordinary skill in the art that memory device 400 can include more than one sense amplifiers SA. For example, memory device 400 can include one sense amplifier SA for each bit line of memory array 405. Moreover, although sense amplifier SA 415 is shown as a separate entity, it will be apparent to a person with ordinary skill in the art after reading this disclosure that sense amplifier SA 415 can be part of memory array 405. In example embodiments, sense amplifier SA 415 is same as or similar to one or more of first sense amplifier SA1, second sense amplifier SA2, and third sense amplifier SA3 of memory array 300 of FIG. 3.

Memory device 400 further includes a logic circuit 425 and a latch 430. Logic circuit 425 is connected to sense amplifier SA 415 at a second node 435. Logic circuit 425 is further connected to a latch 430. For example, an input terminal of logic circuit 425 is connected to an output of sense amplifier SA 415 at second node 435 and an output terminal of logic circuit 425 is connected to an input terminal of latch 430. Logic circuit 425 is operative to provide an output of memory array 405 (also referred to as DOUT) to latch 430. For example, logic circuit 425 is operative to inverse an output of sense amplifier SA 415 and provide the inverted output of sense amplifier SA 415 as the output of memory array 405 to latch 430. Latch 430 is operative to store the output of memory array 405. In example embodiments, logic circuit 425 is a NOT logic gate. However, it will be apparent to a person with ordinary skill in the art after reading this disclosure that other types of invertor circuits are within scope of the disclosure.

Continuing with FIG. 4A, memory device 400 further includes a feedback circuit 440. Feedback circuit 440 is connected between a first node 420 and second node 435. That is, a first terminal of feedback circuit 440 is connected to first node 420 and a second terminal of feedback circuit 440 is connected to second node 435. Feedback circuit 440 includes a feedback transistor 445 and a de-glitch circuit 450. A first terminal of de-glitch circuit 450 is connected to second node 435 and a second terminal of de-glitch circuit is connected to a third node 455. De-glitch circuit 450 is operative to prevent a large current passing to third transistor 445. For example, de-glitch circuit 450 is operative to suppress or limit sudden bursts or spikes. In example embodiments, de-glitch circuit 450 implements a time delay between output modulations to prevent a large current passing to third transistor 445.

A gate of feedback transistor 445 is connected to third node 455. A source of feedback transistor 445 is connected to a supply voltage (that is, a VDD) and a drain of feedback transistor 445 is connected to first node 420. In example embodiments, feedback transistor 445 is a pMOS transistor. However, it will be apparent to a person with ordinary skill in the art after reading this disclosure that other types of transistors are within the scope of the disclosure. In addition, it will be apparent to a person with ordinary skill in the art after reading this disclosure that feedback transistor 445 is symmetrical. That is, the drain of feedback transistor 445 can be connected to the supply voltage and the source of feedback transistor 445 can be connected to first node 420. In operation, when a voltage at a gate of feedback transistor 445 is greater than a threshold voltage for the feedback transistor 445, a feedback current flows through feedback transistor 445 to the selected bit line.

During operation, feedback circuit 440 is operative to provide a better read margin for memory array 405. For example, feedback circuit 440 is operative to bias an unselected word line WL of memory array 405 to a voltage equal to a sense amplifier SA decision level voltage thereby removing a bit line leakage current. In addition, feedback circuit 440 as discussed in greater details in the following sections, by biasing the unselected word line WL to a voltage equal to a sense amplifier SA decision level voltage removes data pattern dependence of memory device 400 on the read margin. For example, when an output of the read operation (that is, DOUT is a logic value 1, an output of sense amplifier SA 415 (that is, second node 435) is a logic value 0. By extension, third node 455 is also at a logic value 0. This switches on feedback transistor 445 thereby connecting the drain of feedback transistor 445, and by extension, first node 420 to a predetermined voltage or a supply voltage (that is, VDD). Thus, the selected bit line is forced to the predetermined voltage thereby suppressing or shutting down the cell current.

Figure 4B:
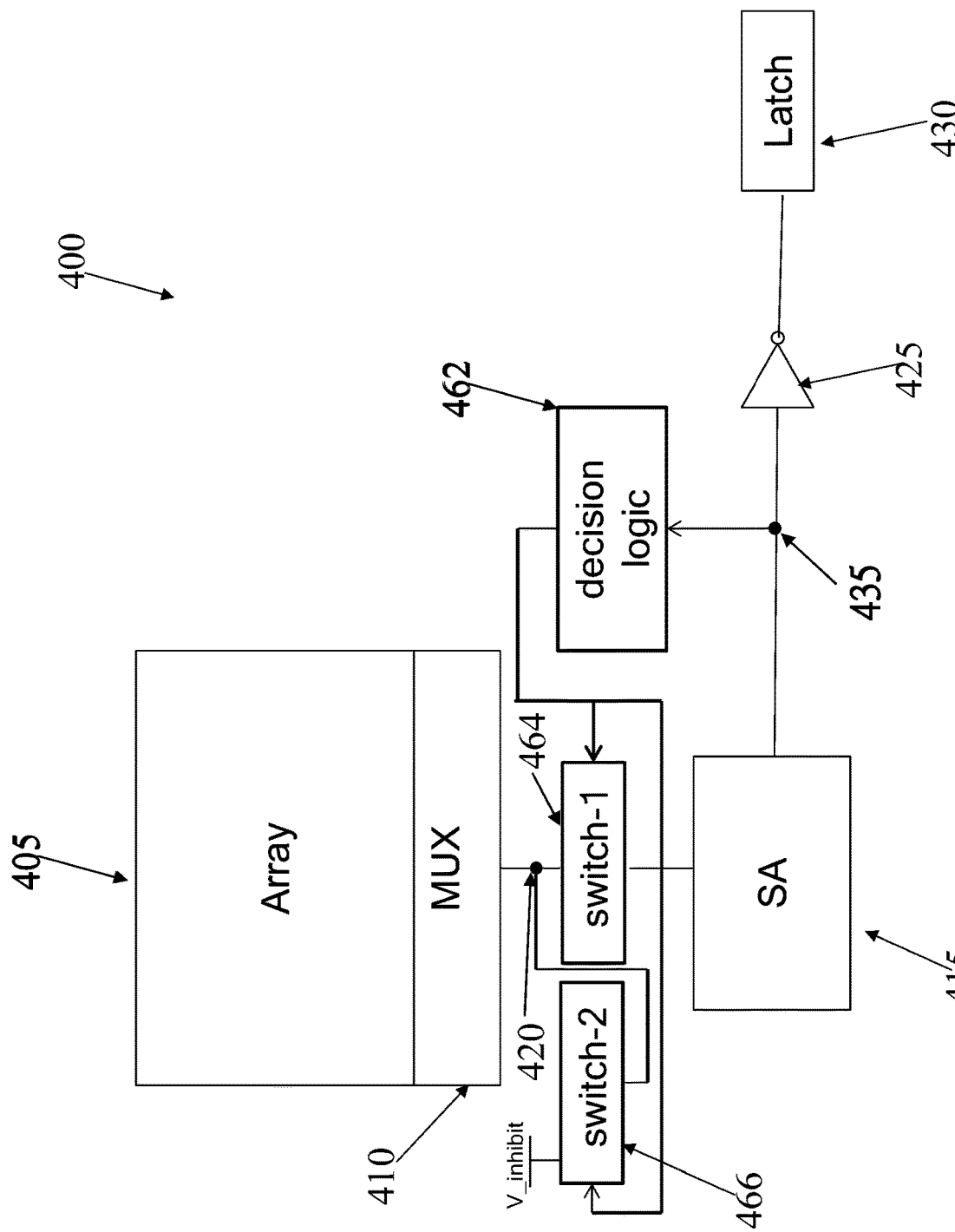
FIG. 4B illustrates memory device with another example feedback circuit, in accordance with some embodiments.

FIG. 4B illustrates memory device 400 with another example feedback circuit, in accordance with some embodiments. As shown in FIG. 4B, memory device 400 includes memory array 405, multiplexer 410, sense amplifier SA 415, logic circuit 425, and latch 430. In addition, memory device 400 includes a decision logic 462, a first switch (that is, switch-1) 464, and a second switch (that is, switch-2) 466. In example embodiments, decision logic 462, first switch (that is, switch-1) 464, and second switch (that is, switch-2) 466 form another example feedback circuit.

First switch 464 is connected between multiplexer 410 and sense amplifier SA 415. That is, a first terminal of first switch 464 is connected to multiplexer 410 (at first node 420) and a second terminal of first switch 464 is connected to sense amplifier SA 415. First switch 464, when switched on, is operative to connect a bit line selected by multiplexer 410 to sense amplifier SA 415. In addition, first switch 464, when switched off, is operative to disconnect the selected bit line from sense amplifier SA 415. In example embodiments, first switch 464 can be a MOSFET, an nMOS transistor, a pMOS transistor, and a CMOS transistor. However, other types of switches are within the scope of the disclosure.

Second switch 466 is connected between multiplexer 410 and a predetermined voltage (that is, V_inhibit). That is, a first terminal of second switch 466 is connected to multiplexer 410 (at first node 420) and a second terminal of second switch 466 is connected to V_inhibit. Second switch 466, when switched on, is operative to connect the selected bit line to V_inhibit. In addition, second switch 466, when switched off, is operative to disconnect the select bit line from V_inhibit. In example embodiments, second switch 466 can be a MOSFET, an nMOS transistor, a pMOS transistor, and a CMOS transistor. However, other types of switches are within the scope of the disclosure. In examples, V_inhibit can be substantially equal to supply voltage (that is, VDD).

Decision logic 462 is operative to selectively switch on and switch off each of first switch 464 and second switch 466 based on an output of sense amplifier SA 415. For example, a first terminal of decision logic 462 is connected to second node 435 and a second terminal of decision logic 462 is connected to each of first switch 464 and second switch 466. Decision logic 462 is operative to determine the output (that is, DOUT_B) of sense amplifier SA 415. In response to determining that an output value of sense amplifier SA 415 is a logic value 0, decision logic 462 switches on second switch 466. In addition, in response to determining that the output of sense amplifier SA 415 is a logic value 0, decision logic 462 switches off first switch 464. Switching on of second switch 466 connects the selected bit line to V_inhibit. In addition, switching off of first switch 464 turns off a discharge path for the selected bit line. Therefore, the cell current is suppressed or is shut down.

Figure 4C:
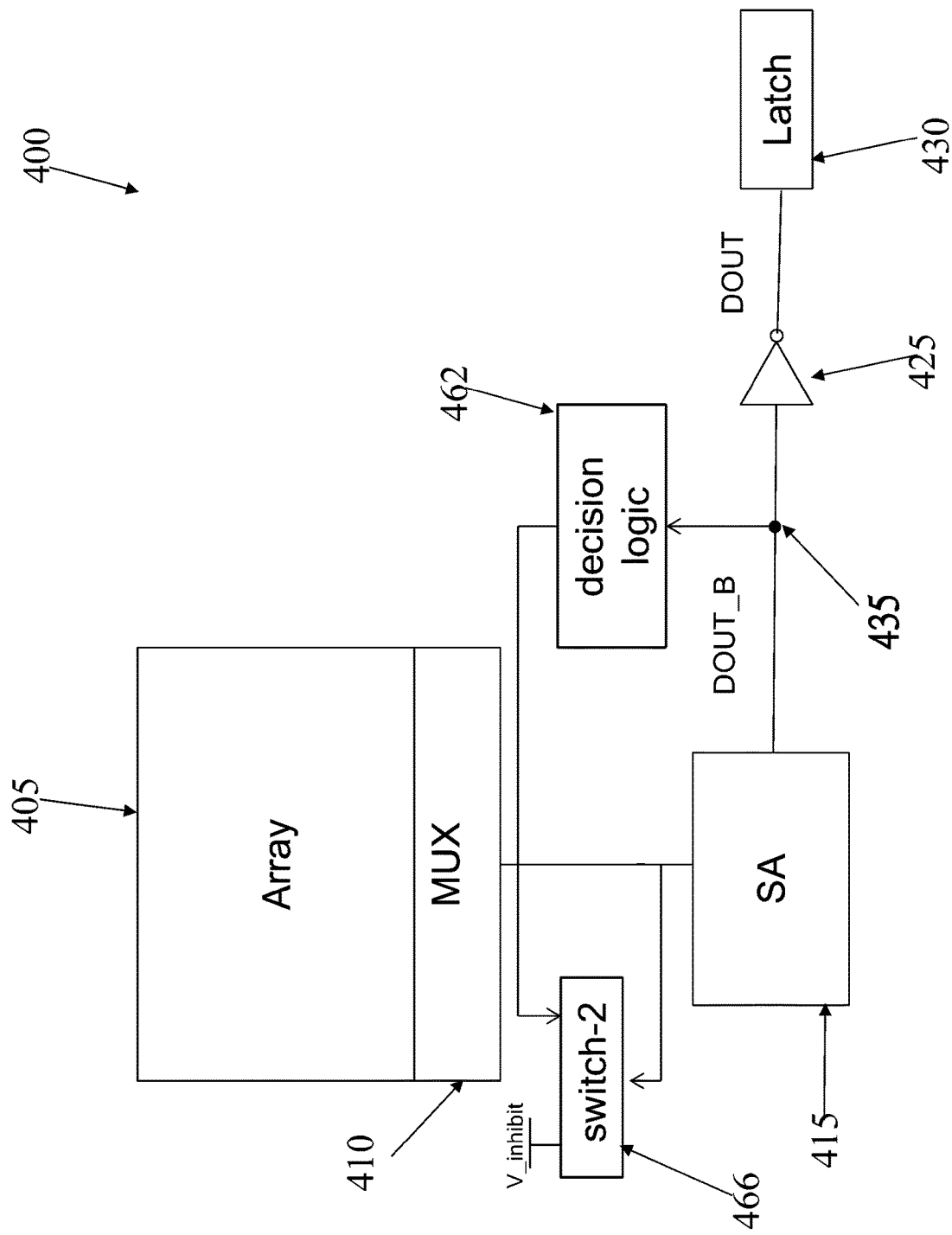
FIG. 4C illustrates memory device with yet another example feedback circuit, in accordance with some embodiments.

In example embodiments, decision logic 462 is also referred to as a decision circuit and may include a transistor, for example, feedback transistor 445. In example embodiments, the example feedback circuit of FIG. 4B can be configured to include fewer switches. For example, FIG. 4C illustrates memory device 400 with yet another example feedback circuit, in accordance with some embodiments. As shown in FIG. 4C, memory device 400 includes memory array 405, multiplexer 410, sense amplifier SA 415, logic circuit 425, and latch 430. In addition, memory device 400 includes decision logic 462 and second switch 466. In example embodiments, decision logic 462 and second switch 466 form yet another example feedback circuit.

Second switch 466 is connected between multiplexer 410 and a predetermined voltage (that is, V_inhibit). That is, a first terminal of second switch 466 is connected to multiplexer 410 (at first node 420) and a second terminal of second switch 466 is connected to V_inhibit. Second switch 466, when switched on, is operative to connect multiplexer 410 with V_inhibit. In addition, second switch 466, when switched off, is operative to disconnect multiplexer 410 from V_inhibit. In example embodiments, first switch 464 can be a MOSFET, an nMOS transistor, a pMOS transistor, and a CMOS transistor. However, other types of switches are within the scope of the disclosure. In examples, V_inhibit can be substantially equal to supply voltage (that is, VDD).

Decision logic 462 is operative to selectively switch on and switch off second switch 466. For example, a first terminal of decision logic 462 is connected to second node 435 and a second terminal of decision logic 462 is connected to second switch 466. Decision logic 462 is operative to determine an output (that is, DOUT_B) of sense amplifier SA 415. In response to determining that an output value of sense amplifier SA 415 is a logic value 0, decision logic 462 switches on second switch 466. Switching on of second switch 466 forces the selected bit line to be connected to the V_inhibit. Connecting the selected bit line to the V_inhibit suppresses or shuts down the cell current.

Figure 4D:
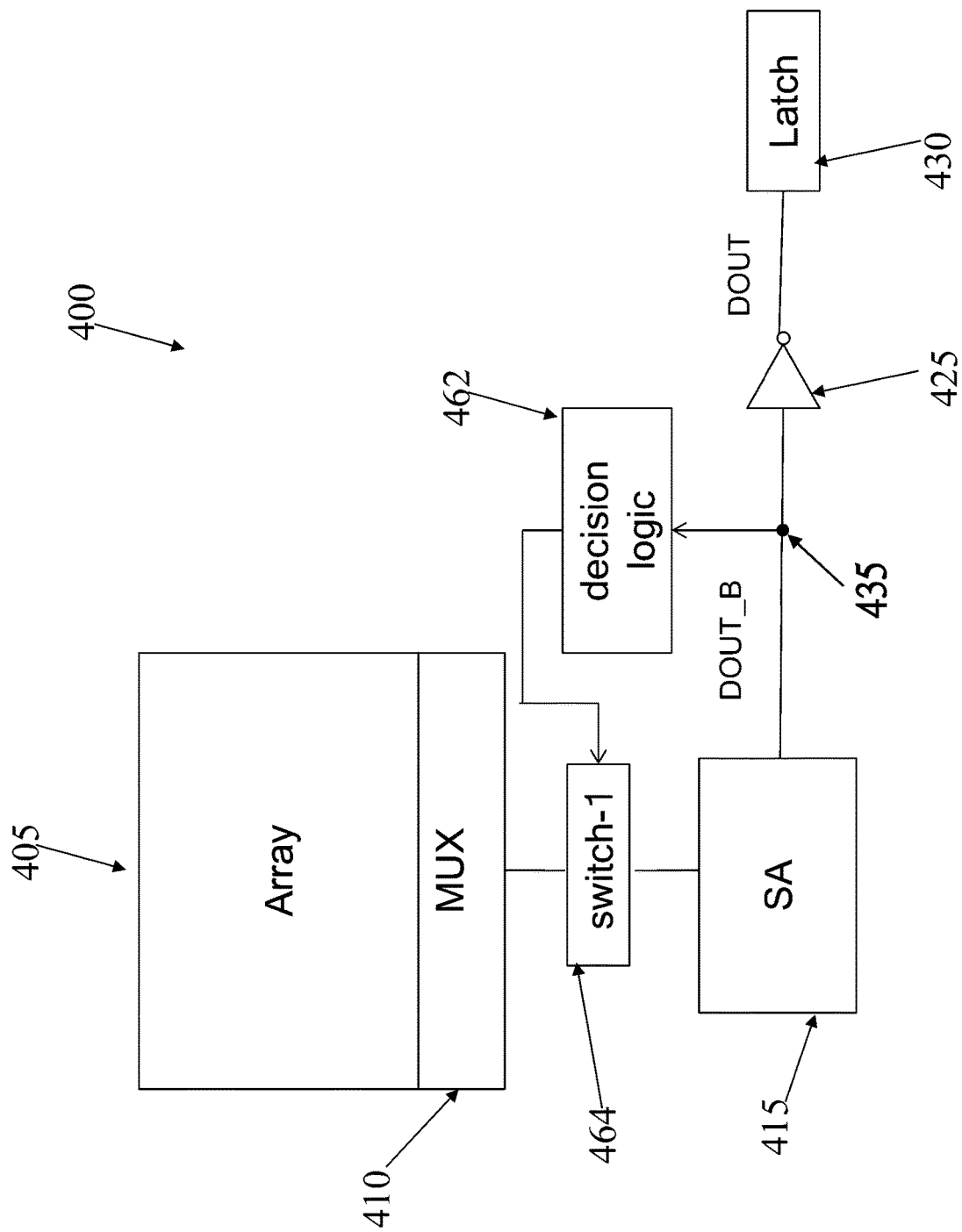
FIG. 4D illustrates memory device with yet another example feedback circuit, in accordance with some embodiments.

FIG. 4D illustrates memory device 400 with yet another example feedback circuit, in accordance with some embodiments. As shown in FIG. 4D, memory device 400 includes memory array 405, multiplexer 410, sense amplifier SA 415, logic circuit 425, and latch 430. In addition, memory device 400 includes decision logic 462 and first switch 464. In example embodiments, decision logic 462 and first switch 464 form yet another example feedback circuit.

First switch 464 is connected between multiplexer 410 and sense amplifier SA 415. That is, a first terminal of first switch 464 is connected to multiplexer 410 (at first node 420) and a second terminal of first switch 464 is connected to sense amplifier SA 415. First switch 464, when switched on, is operative to connect multiplexer 410 with sense amplifier SA 415. In addition, first switch 464, when switched off, is operative to disconnect multiplexer 410 from sense amplifier SA 415. In example embodiments, first switch 464 can be a MOSFET, an nMOS transistor, a pMOS transistor, and a CMOS transistor. However, other types of switches are within the scope of the disclosure.

Decision logic 462 is operative to selectively switch on and switch off first switch 464. For example, a first terminal of decision logic 462 is connected to second node 435 and a second terminal of decision logic 462 is connected to first switch 464. Decision logic 462 is operative to determine an output (that is, DOUT_B) of sense amplifier SA 415. In response to determining that an output value of sense amplifier SA 415 is a logic value 0 decision logic 462 switches off first switch 464. Switching off of first switch 464 disconnects the selected bit line from sense amplifier SA 415. By extension, switching off of first switch 464 disconnects the selected bit line from a discharge path thereby shutting down the cell current.

Figure 4E:
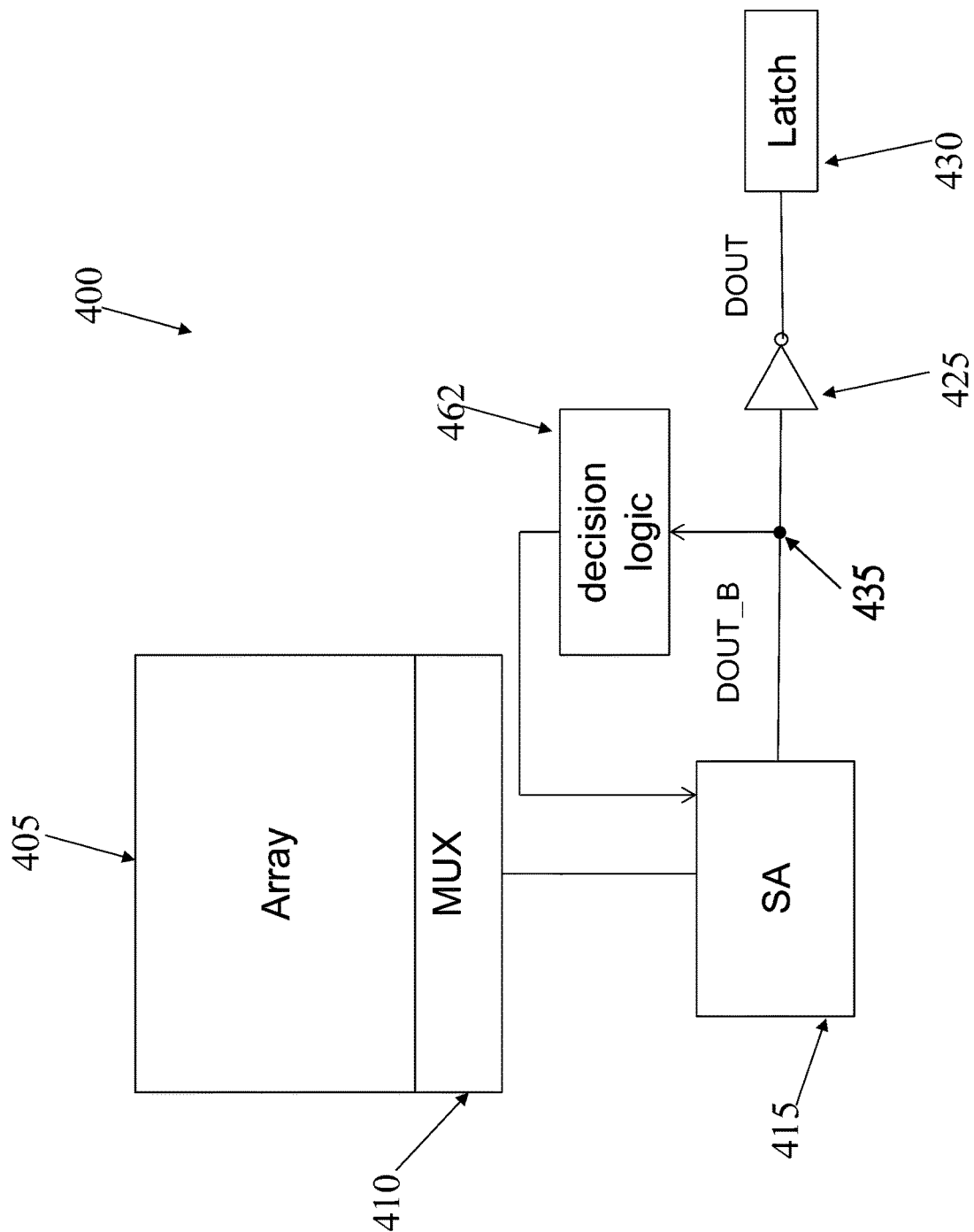
FIG. 4E illustrates memory device with yet another example feedback circuit, in accordance with some embodiments.

FIG. 4E illustrates memory device 400 with yet another example feedback circuit, in accordance with some embodiments. As shown in FIG. 4E, memory device 400 includes memory array 405, multiplexer 410, sense amplifier SA 415, logic circuit 425, and latch 430. In addition, memory device 400 includes decision logic 462. In example embodiments, decision logic 462 forms yet another example feedback circuit.

A first terminal of decision logic 462 is connected to second node 435 and a second terminal of decision logic 462 is connected to sense amplifier SA 415. Decision logic 462 is operative to determine an output (that is, DOUT_B) of sense amplifier SA 415. In response to determining that an output value of sense amplifier SA 415 is a logic value 0, decision logic 462 switches off a discharge path for the selected bit line in sense amplifier SA 415. Switching off of the discharge path for the selected bit line results in suppression or shutting down of the cell current.

Figure 5:
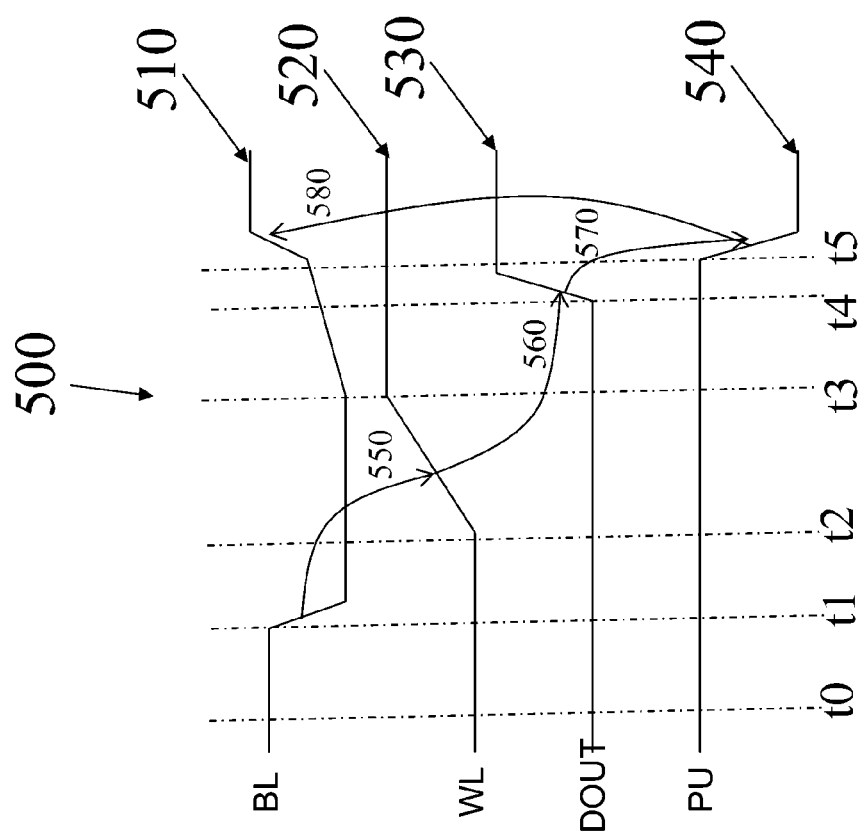
FIG. 5 illustrates a graph with different signals of a memory device, in accordance with some embodiments.

FIG. 5 illustrates a graph 500 with different signals of memory device 400, in accordance with some embodiments. A first plot 510 of graph 500 is a representative of a bit line BL voltage. A second plot 520 of graph 500 is a representative of a word line WL voltage. A third plot 530 of graph 500 is a representative of an output voltage. A fourth plot 540 of graph 500 is a representative of a feedback voltage. As shown in FIG. 5, initially (that is, at a time t0), the bit line BL voltage is at a first value (that is, a logic value high), the word line WL voltage is at a second value (that is, a logic value low), the output signal is also at a second value (that is, a logic value low), and the feedback voltage is at a first value (that is, a logic value high).

As illustrated by first plot 510, at a first time (that is, at a time t1), the bit line BL voltage starts changing from the first value (that is, a logic value high) to a second value (that is, a logic value low). In addition, and as illustrated by second plot 520, after a predetermined time from the first time t1 (that is, at a time t2), the word line WL voltage starts changing from the second value to a first value (arrow 550). That is, at the time t2, the word line WL voltage starts changing from a logic low to a logic high. This change from a logic low to a logic high for the word line WL voltage is completed at a third time (that is, at a time t3). As illustrated by third plot 530, after a predetermined time from the completion of change of the word line WL voltage from a logic low to a logic high, the output signal, at a fourth time (that is, at a time t4) changes from a second value to a first value (arrow 560). That is, at the time t4, the output signal changes from a logic low to a logic high.

Moreover, and as illustrated by fourth plot 540, after a predetermined time from the completion of change of the output signal from a logic low to a logic high, the feedback signal (represented as PU), at a fifth time (that is, at a time t5) changes from a first value to a second value (arrow 570). That is, at the time t5, the feedback signal changes from a logic high to a logic low. Moreover, and as shown in first plot 510, the bit line BL voltage changes from a second value to a third value between the third time (that is, the time t3) and the fifth time (that is, the time t5). In addition, and as shown in first plot 510, the bit line BL voltage changes from a third value to a first value after a predetermined time from the fifth time (that is, the time t5) (arrow 580). Hence, feedback circuit 440 provides a feedback thereby biasing an unselected word-line programmable WLP to a voltage equal to a sense amplifier SA decision level, thereby removing a bit line BL leakage current.

Figure 6:
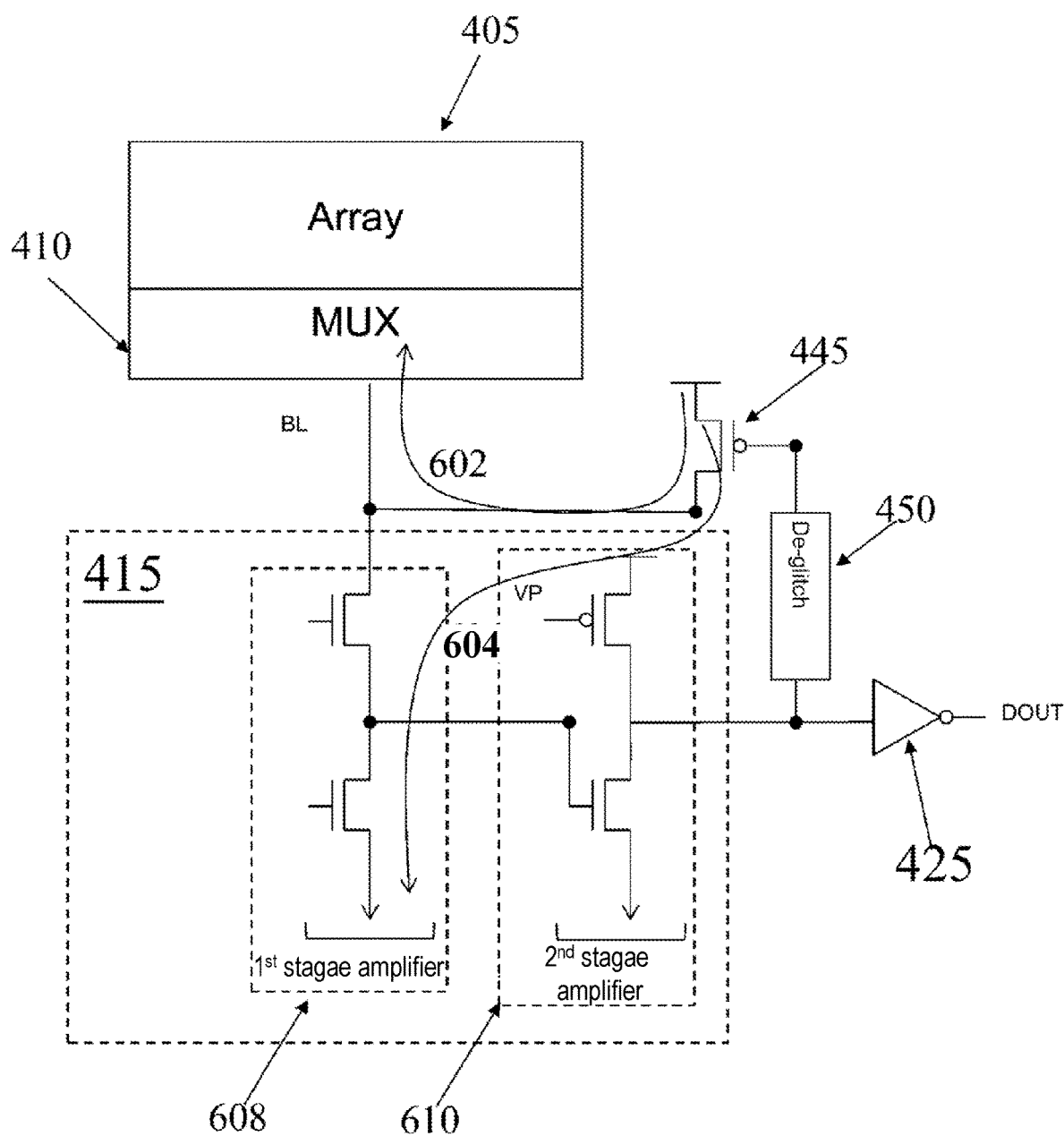
FIG. 6 illustrates redirection of a bit line leakage current, in accordance with some embodiments.

FIG. 6 illustrates redirection of a bit line BL leakage current, in accordance with some embodiments. For example, FIG. 6 illustrates redirection of the bit line BL leakage current from memory device 400. As shown in FIG. 6, the feedback current is redirected through feedback transistor 445 to the selected bit line BL (arrow 602). More specifically, a portion of the feedback current (arrow 602) is redirected to the selected bit line BL and another portion of the feedback current (arrow 604) is directed as a sensing reference current (that is, Iref).

In example embodiments, another portion of the feedback current (arrow 604) is directed as a sensing reference current (that is, Iref) to a first stage amplifier of sense amplifier SA 415. For example, and as shown in FIG. 6, sense amplifier SA 415 includes a first stage amplifier 608 and a second stage amplifier 610. First stage amplifier 608 includes a first plurality of transistors and second stage amplifier 610 includes a second plurality of transistors. The sensing reference current (that is, Iref) is also redirected to feedback transistor 445 of feedback circuit 440 (arrow 604) via first stage amplifier 608. This biases an unselected word-line programmable WLP to a voltage equal to a sense amplifier SA decision level thereby removing a bit line BL leakage current.

Figure 7:
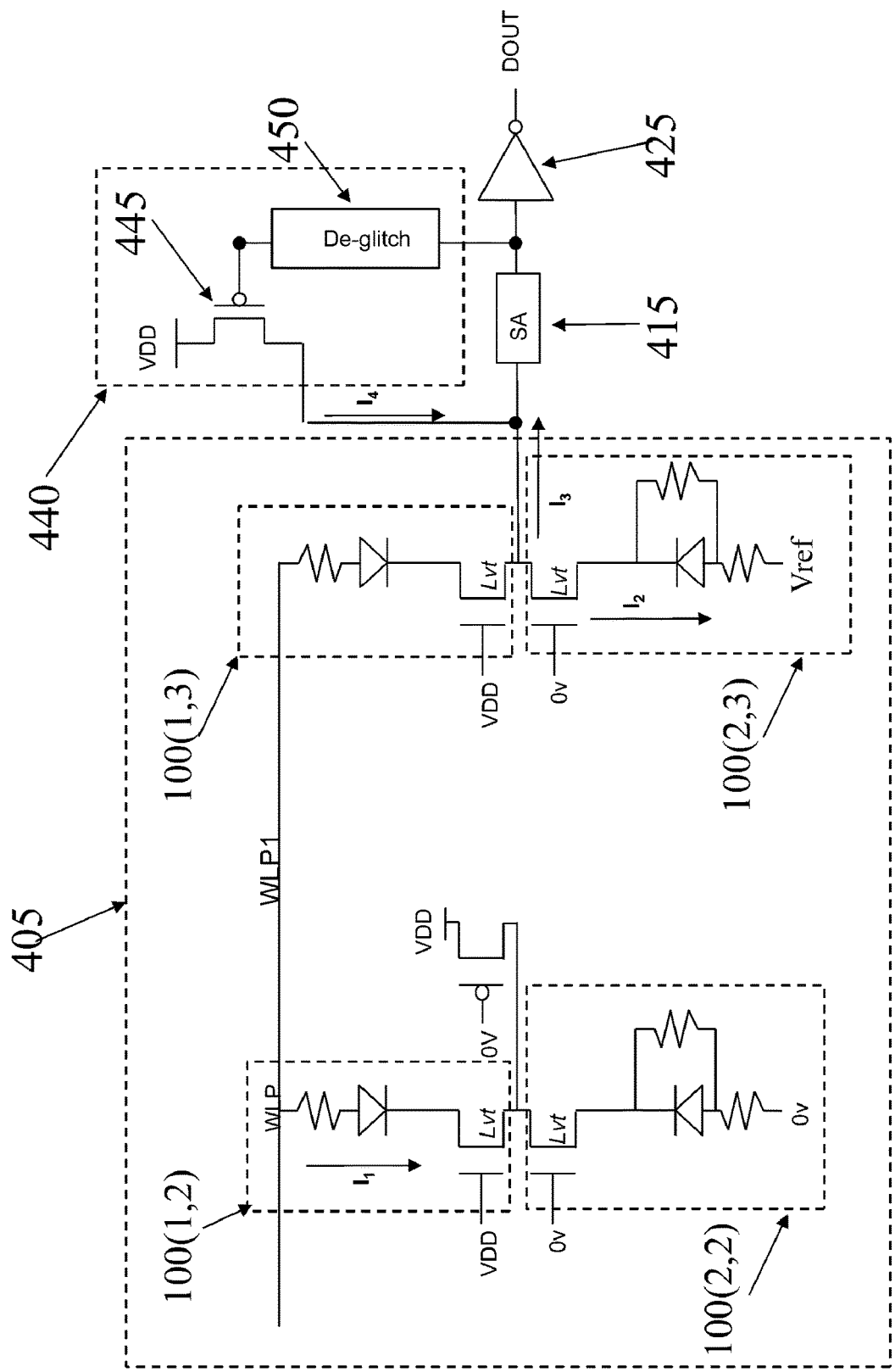
FIG. 7 illustrates biasing an unselected word line of a memory device, in accordance with some embodiments.

FIG. 7 shows biasing of an unselected memory cells of memory device 400, in accordance with some embodiments. As shown in FIG. 7, memory device 400 includes memory array 405, sense amplifier SA 415, invertor circuit 425, and feedback circuit 440. Memory array 405 includes second memory cell 100(1,2), third memory cell 100(1,3), fifth memory cell 100(2,2), and sixth memory cell 100(2,3). It will be apparent to person with ordinary skill in the art after reading this disclosure that memory array 405 is shown to include only four memory cells 100 for illustration purpose only, and it can include a different number of memory cells.

In some embodiments, during an example read operation, second memory cell 100(1,2) is a half selected memory cell with a forward bias of less than 0.9V, third memory cell 100(1,3) is a fully selected memory cell with a forward bias of greater than 1.0V, fifth memory cell 100(2.2) is an unselected memory cell with a reserved bias of VDD, and sixth memory cell 100(2,3) is an unselected cell with a reserved bias. Each of second memory cell 100(1,2) and third memory cell 100(1,3) are connected to first programmable word line WLP1. In addition, third memory cell 100(1,3) and sixth memory cell 100(2,3) are connected to a selected bit line BL while second memory cell 100(1,2) and fifth memory cell 100(2,2) are connected to an unselected bit line BL. Moreover, each of second memory cell 100(1,2) and third memory cell 100(1,3) are programmed while fifth memory cell 100(2,2) and sixth memory cell 100(2,3) are not programmed.

During the read operation, a first current (that is, $I_1$) flows through second memory cell 100(1,2). In addition, a second current (that is, $I_2$) flows through sixth memory cell 100(2,3), and a third current (that is, $I_3$) flows through sense amplifier SA 415. Feedback circuit 440 provides additional feedback current (that is, $I_4$) to sense amplifier SA 415 during the read operation, thereby biasing an unselected memory cell (that is, sixth memory cell 100(2,3)) connected to the selected bit line equal to a sense amplifier level (that is, Vref). Biasing of an unselected memory cell (that is, sixth memory cell 100(2,3)) connected to the selected bit line equal to a sense amplifier SA level (that is, Vref) reduces a leakage current for memory array 405.

Figure 8:
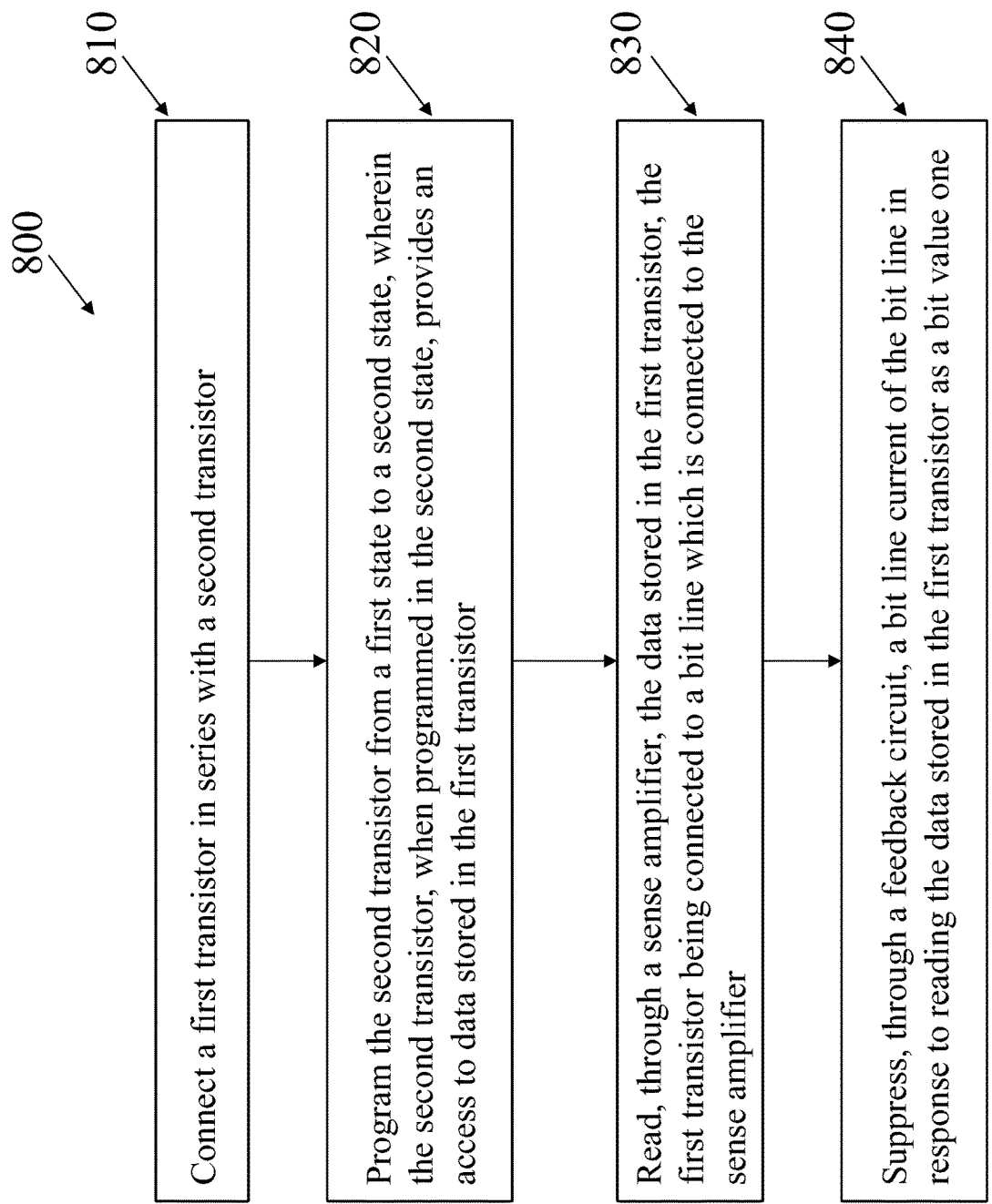
FIG. 8 illustrates steps of a method for reading data from a memory device, in accordance with some embodiments.

FIG. 8 is a flow diagram illustrating a method 800 for reading data from a memory device, in accordance with some embodiments. Method 800 may be performed by a processor. In addition, method 800 may be stored as instructions on a memory device, which when executed by a processor can cause the processor to perform method 800.

At block 810 of method 800, a first transistor is connected in series with a second transistor. For example, first transistor 105 is connected in series with second transistor 110. One of first transistor 105 and second transistor 110 is programmable. In some examples, connecting first transistor 105 to second transistor 110 creates one-time programmable memory cell 100.

At block 820 of method 800, the second transistor is programmed. For example, second transistor 110 of memory cell 100 is programmed. In example embodiments, and as discussed with reference to FIGS. 1-7, second transistor 110 is programmed by switching off second transistor 110 and applying a programmable voltage (that is, Vprogram) at a source/drain. The programmable voltage breaks a resistance between a source and a drain (for example, between drain 160 and source 170) of second transistor 110.

At block 830 of method 800, the data stored in the first transistor is read through a sense amplifier. For example, first transistor 105 is connected to a bit line which is connected to sense amplifier SA 415. The data stored in first transistor 105 is read through sense amplifier SA 415 through the bit line. Sense amplifier SA 415 provides the read data as an output (that is DOUT) in latch 430.

At block 840 of method 800, a bit line current of the bit line is suppressed through a feedback circuit in response to reading the data stored in the memory device as a bit value one. For example, and as discussed with reference to FIGS. 4A, 4B, 4C, 4D, 4E, 5, 6, and 7 of the disclosure, feedback circuit 440 of memory device 400 suppresses the bit line current when a bit value of one is read from the bit line.

In accordance with example embodiments, the techniques disclosed suppresses or inhibits a bit line current for a selected bit-line of memory device 400 through a feedback circuit 440 when a data value of one is read from the selected bit line. As a result, a bit line BL level is higher for the weak bit (that is, the bit value of zero) and read margin for memory device 400 is improved. Moreover, by biasing an unselected bit line to a voltage equal to a sense amplifier SA decision level, a bit line BL leakage is removed. In addition, the techniques disclosed herein remove the data-pattern dependence on the read margin for memory device 400.

In example embodiments, a memory device comprises: a first transistor; a second transistor connected in series with the first transistor, wherein the second transistor is programmable between a first state and a second state; a bit line connected to the second transistor; a sense amplifier connected to the bit line, wherein the sense amplifier is operative to sense data from the bit line; and a feedback circuit connected to the sense amplifier, wherein the feedback circuit comprises a decision circuit and a first switch, wherein the decision circuit is operative to selectively switch off the first switch to shut down a current discharge path for a selected bit line of the plurality of bit lines.

In accordance with example embodiments, a memory device comprises: a memory array comprising a plurality of memory cells, each of the plurality of memory cells comprising a first transistor connected in series with an access transistor, wherein the first transistor is programmable into a first state and a second state; a plurality of bit lines, each of the plurality of bit lines connected to a first plurality of memory cells in a row of the memory array via the first transistor; a sense amplifier connected to the plurality of bit lines of the memory array, wherein the sense amplifier is operative to sense data from each of the plurality of memory cells; and a feedback circuit connected to the sense amplifier, wherein the feedback circuit is operative to control a bit line current of one or more selected bit lines of the plurality of bit lines.

In example embodiments, a method of operating a memory device comprises: connecting a first transistor in series with a second transistor; programming the first transistor from a first state to a second state, wherein the first transistor, when programmed in the second state, provide an access to data stored in the second transistor; reading, through a sense amplifier, the data stored in the first transistor a bit line connected to the first transistor; and injecting, through a feedback circuit, a feedback current into the bit line in response to reading the data stored in the memory device as a bit value one.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
    a first transistor;
    a second transistor connected in series with the first transistor, wherein the second transistor is programmable between a first state and a second state;
    a bit line connected to the second transistor;
    a sense amplifier connected to the bit line, wherein the sense amplifier is operative to sense data from the bit line; and
    a feedback circuit connected between an output of the sense amplifier and the bit line, wherein the feedback circuit is operative to suppress a bit line current of the bit line in response to the sense amplifier sensing a first value from the first transistor.

2. The memory device of claim 1, wherein the feedback circuit comprises a decision logic circuit and a first switch, wherein the decision logic circuit is operative to selectively switch off the first switch to shut down a current discharge path for the bit line.

3. The memory device of claim 2, wherein the first switch is connected between the bit line and the sense amplifier, and wherein the decision logic circuit is connected between the output of the sense amplifier and the first switch.

4. The memory device of claim 2, the feedback circuit further comprises a second switch connected between a predetermined voltage node and the bit line.

5. The memory device of claim 4, wherein the second switch is connected to the decision logic circuit, and wherein the decision logic circuit switches on the second switch to connect the bit line to the predetermined voltage node.

6. The memory device of claim 1, wherein the feedback circuit comprises a third transistor.

7. The memory device of claim 1, wherein the second transistor is programmed by applying a pre-determined current across the second transistor.

8. The memory device of claim 1, wherein the memory device comprises a one-time programmable memory device.

9. A memory device comprising:
    a one time programmable memory cell comprising a first transistor and a second transistor connected in series with the first transistor;
    a bit line connected to the second transistor;
    a sense amplifier connected to the bit line, wherein the sense amplifier is operative to sense data from the bit line; and
    a feedback circuit connected between an output of the sense amplifier and the bit line, wherein the feedback circuit is operative to suppress a bit line current of the bit line in response to the sense amplifier sensing a first value from the one time programmable memory cell.

10. The memory device of claim 9, wherein the feedback circuit comprises a third transistor, wherein a source/drain of the third transistor is connected to the bit line, a drain/source of the third transistor is connected to a predetermined voltage node, and a gate of the third transistor is connected to the output of the sense amplifier.

11. The memory device of claim 9, wherein the feedback circuit comprises a decision logic circuit and a first switch, wherein the decision logic circuit is operative to selectively switch on the first switch to inject a feedback current into the bit line.

12. The memory device of claim 11, wherein the first switch is connected between the bit line and the predetermined voltage node, and wherein the decision logic circuit is connected between the output of the sense amplifier and the first switch.

13. The memory device of claim 11, wherein the feedback circuit comprises a second switch, wherein the decision logic circuit is operative to selectively switch off the second switch to shut down a current discharge path for the bit line.

14. The memory device of claim 13, wherein the second switch is connected between the bit line and the sense amplifier, and wherein the decision logic circuit is connected between the output of the sense amplifier and the second switch.

15. The memory device of claim 9, wherein the feedback circuit comprises a third transistor.

16. The memory device of claim 9, wherein the memory device comprises a one-time programmable memory device.

17. A method of reading data from a memory device, the method comprising:
    programming a memory device comprising a first transistor and a second transistor, the first transistor being connected in series with the second transistor;
    reading data stored in the memory device through a sense amplifier connected to a bit line, wherein the bit line is connected to the first transistor; and
    suppressing, in response to reading the data stored in the memory device, a bit line current of the bit line through a feedback circuit, wherein the feedback circuit is connected between an output of the sense amplifier and the bit line.

18. The method of claim 17, wherein the feedback circuit comprises a decision logic circuit and a first switch, wherein the decision logic circuit is operative to selectively switch off the first switch to shut down the current discharge path for the bit line.

19. The method of claim 17, wherein programming the memory device comprises programming the first transistor from a first state to a second state, wherein in the second state, the first transistor provides an access to the data stored in the memory device.

20. The method of claim 19, wherein the memory device comprises a one-time programmable memory device.

* * * * *